US006285013B1

(12) United States Patent
Holmes

(10) Patent No.: US 6,285,013 B1
(45) Date of Patent: Sep. 4, 2001

(54) HEAT COIL SUPPORT ASSEMBLY AND METHOD

(75) Inventor: Ronald E. Holmes, Winneconne, WI (US)

(73) Assignee: Nova Industries, Inc., Franklin, WI (US)

( * ) Notice: Subject to any disclaimer, the term of this patent is extended or adjusted under 35 U.S.C. 154(b) by 0 days.

(21) Appl. No.: 09/399,557

(22) Filed: Sep. 20, 1999

Related U.S. Application Data

(63) Continuation-in-part of application No. 08/939,670, filed on Sep. 29, 1997, now Pat. No. 5,954,983.

(51) Int. Cl.[7] ................................ H05B 3/06; H01L 3/20; H01L 3/14

(52) U.S. Cl. .......................... 219/536; 338/303; 338/304; 219/532

(58) Field of Search .................................... 219/536, 532, 219/520, 542, 538; 338/303, 304, 305, 299, 58

(56) References Cited

U.S. PATENT DOCUMENTS

| | | | | |
|---|---|---|---|---|
| 2,856,500 | | 10/1958 | Hartman | 219/19 |
| 3,846,619 | | 11/1974 | Wightman et al. | 219/532 |
| 4,250,399 | | 2/1981 | King | 219/532 |
| 4,268,742 | | 5/1981 | Cottrell et al. | 219/532 |
| 4,363,959 | | 12/1982 | Cottrell et al. | 219/532 |
| 4,458,141 | * | 7/1984 | Howard et al. | 219/532 |
| 4,472,624 | | 9/1984 | Janning | 219/532 |
| 4,481,411 | * | 11/1984 | Roth | 219/532 |
| 4,528,441 | | 7/1985 | Seal et al. | 219/532 |
| 4,628,189 | | 12/1986 | Danko | 219/532 |
| 4,692,599 | | 9/1987 | Howard et al. | 219/532 |
| 4,857,707 | * | 8/1989 | Dall | 392/485 |
| 5,093,558 | * | 3/1992 | Blystone et al. | 219/532 |
| 5,122,640 | | 6/1992 | Holmes | 219/532 |
| 5,578,232 | * | 11/1996 | Engelke | 219/532 |

OTHER PUBLICATIONS

ALCO TRI–LOK III, Emerson Electric Co., Technical Data Sheet.

Insulator Assembly Drawing, Electric Products Divioson of E. R. Wagner Manufacturing Company, Jun. 1, 1984.

* cited by examiner

*Primary Examiner*—Teresa Walberg
*Assistant Examiner*—Daniel Robinson
(74) *Attorney, Agent, or Firm*—Andrus, Sceales, Starke & Sawall

(57) ABSTRACT

An insulating support structure for a helical wire heating coil for an electric resistance heating element includes a plurality of insulating standoff members supported by a metallic support frame. The insulating standoffs each include a pair of wedge portions that are used to separate the individual convolutions of the helical wire heating coil. Located inwardly from each of the wedge portions are a pair of V-shaped coil grooves sized to receive a portion of an individual convolution of the helical wire heating coil. A retainer tab extends into and forms one surface of the coil groove such that the wire heating coil contacts the retainer tab and a pair of contact surfaces that define the coil groove. The insulating standoffs are each supported by an arm contained on the support frame. Each of the arms includes a pair of tines which combine to form an open slot within the arm. The insulating standoff is captured between the tines by a pair of locking projections on the outer end of the tines. The tines are positioned within a pair of recessed attachment slots in the standoff such that the standoff is securely held between the tines. The support frame is preferably stamped from sheet metal and is adapted to receive the standoffs using automated assembly techniques.

18 Claims, 4 Drawing Sheets

FIG. 2
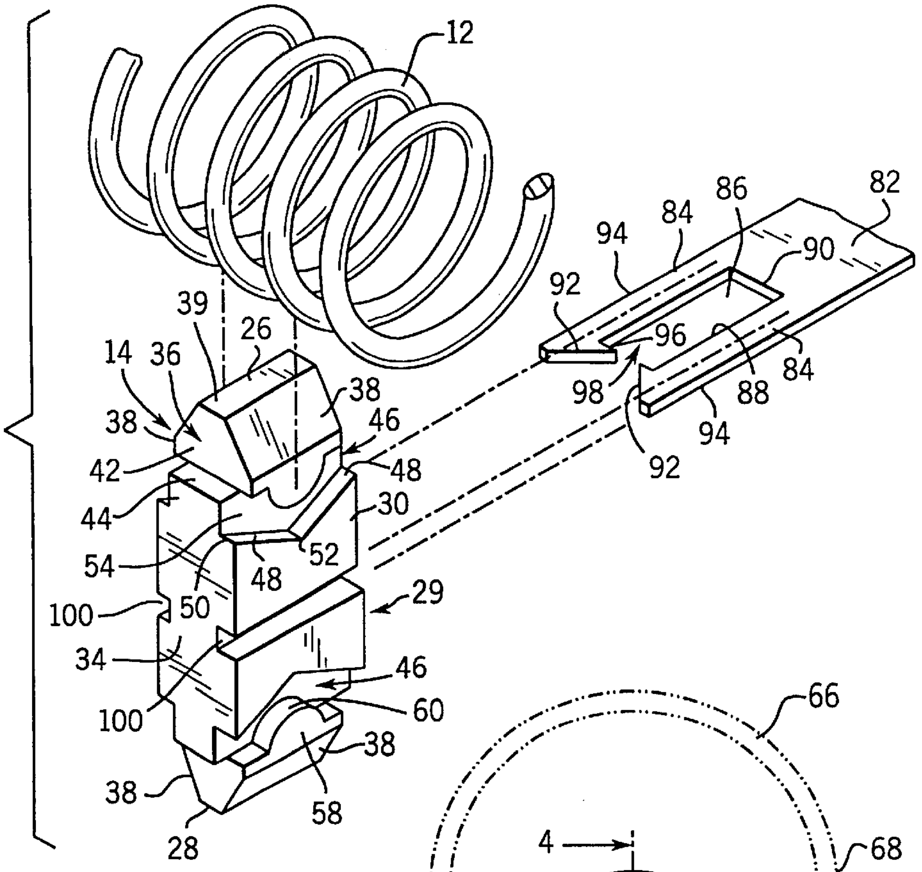
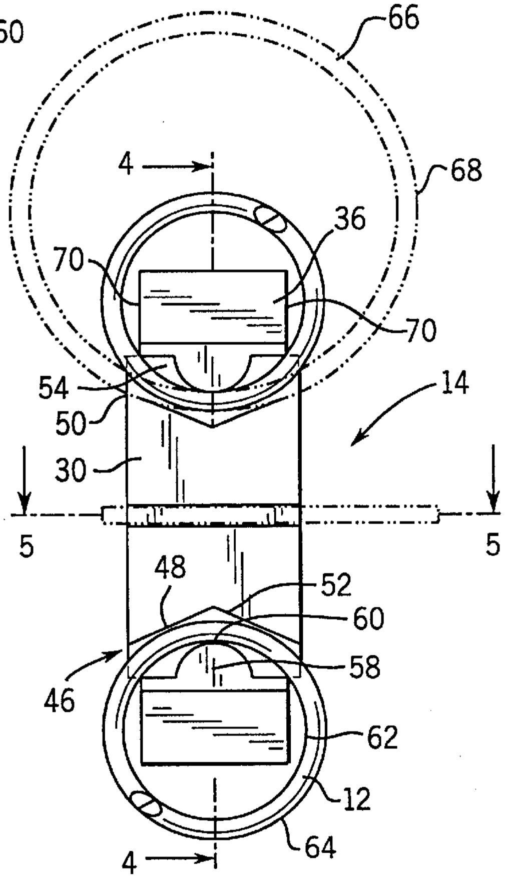
FIG. 3
FIG. 4
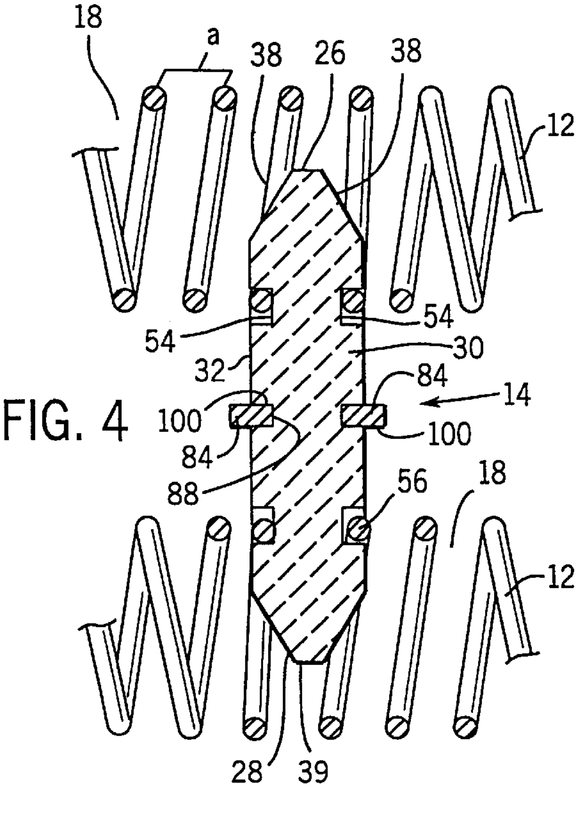

FIG. 8
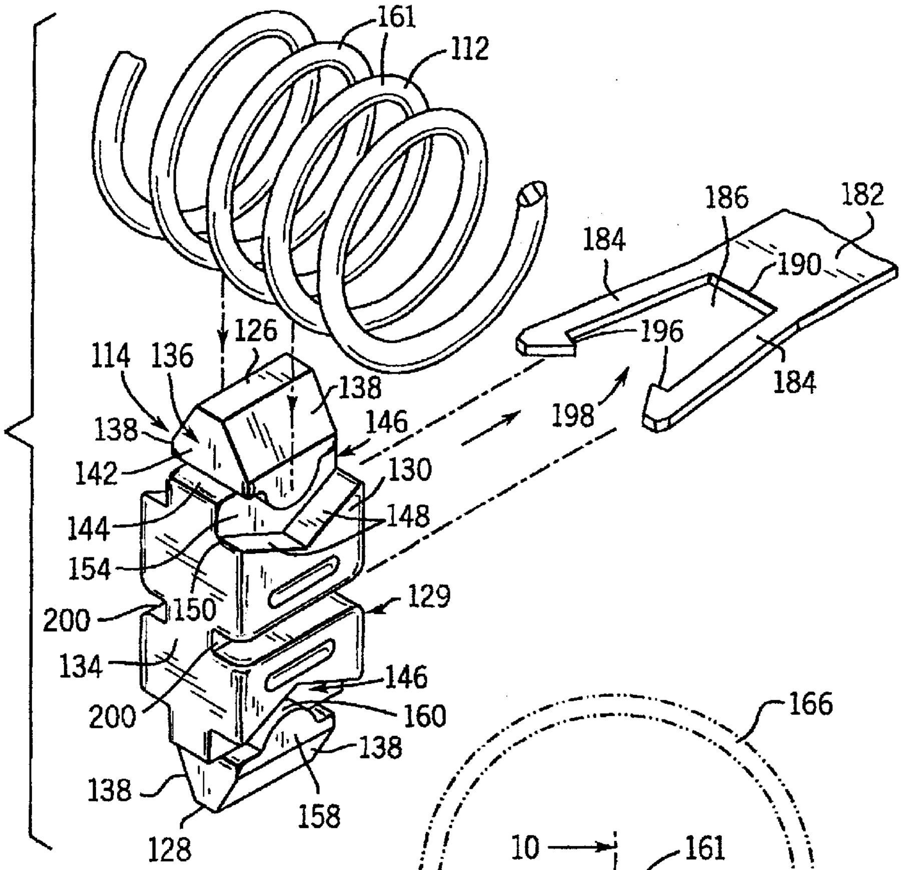
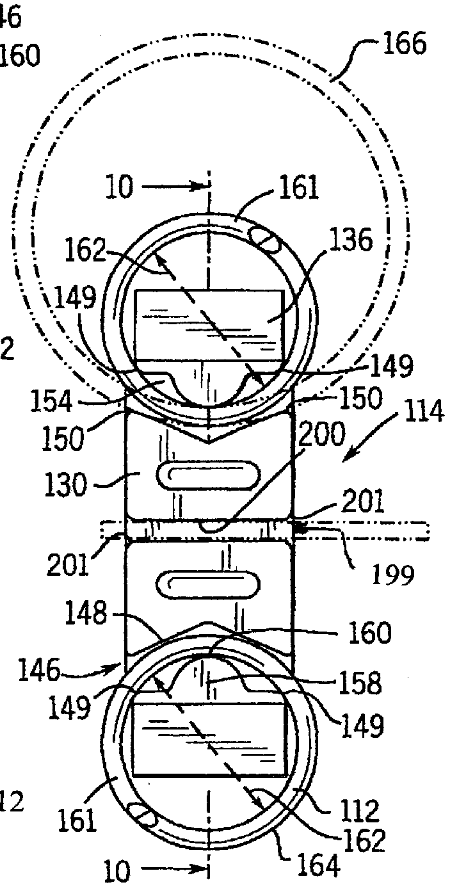
FIG. 9
FIG. 10
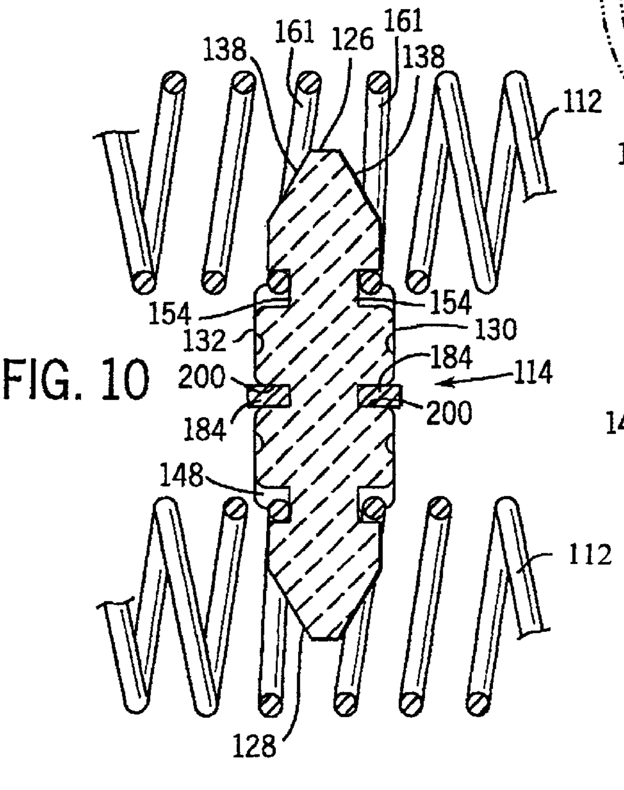

HEAT COIL SUPPORT ASSEMBLY AND METHOD

This is a continuation-in-part of application Ser. No. 08/939,670, filed Sep. 29,1997, now U.S. Pat. No. 5,954, 983.

BACKGROUND OF THE INVENTION

The present invention relates to electric resistance heating elements. More particularly, the invention relates to an insulating standoff and support structure for a helical wire heating coil used in such heating elements.

Electric heating elements utilizing helical wire heating coils are old and well known in the art. A helical wire heating coil is typically mounted on a supporting structure and strung between a number of ceramic insulating standoffs that provide direct support for the heating coil and isolate the heating coil from the supporting structure, which is generally some type of metal framework. It is important that the insulating standoffs hold the coil against both lateral displacement out of the individual standoff and movement in the direction of the longitudinal axis of the coil. Thus, it is common in the prior art ceramic insulating standoffs to capture one or more turns of the helical coil to hold the same against lateral displacement and axial movement.

One common prior art standoff is typified by the constructions shown in U.S. Pat. Nos. 4,363,959 and 4,692,599. In each of these patents, a ceramic insulating standoff for the helical coil of a heating element includes a generally thin, flat body with two or more hook-like notches on one or both ends. A few turns or convolutions of the heating coil are separated slightly and retained in the hook-like notches by the inherent resiliency of the coil. The longitudinal axis of the coil extends generally parallel to the thin, flat body of the insulator with adjacent turns of the coil held in oppositely facing notches. To attach the coil to the supports, the coil must be stretched axially and/or twisted rather severely from its axial direction, resulting in the possibility of stretching the wire beyond its yield point and causing a permanent deformation to the coil.

Another somewhat similar insulating standoff is shown in U.S. Pat. No. 4,250,399. The insulator shown in this patent also has a relatively thin, flat ceramic body with a single coil supporting notch centered in one edge. The notch extends generally perpendicular to the flat body and supports a portion of the coil. The edge of the insulator body on both sides of the notch is provided with downwardly opening lips which engage the coil turns on each face of the body to prevent the coil from being withdrawn after attachment. In order to attach the coil to the insulator body, however, the coil must be turned so that the coil axis is 90° to its final position in order to insert one turn of the coil into the slot. Additionally, the insulator is connected to a metal framework by a finger formed on the framework that is received in an opening in the insulator. The assembly shown in the '399 patent requires a complicated procedure for both mounting the insulating standoffs to the support frame and for mounting the coil to the insulating standoffs, which can be tedious, time-consuming and costly.

U.S. Pat. Nos. 4,472,624, 4,528,441, and 4,628,189 all disclose somewhat similar insulating standoffs that attempt to solve certain of the assembly problems described above. Each of these patents utilizes a construction intended to obviate the need to twist and distort the coil before its attachment to the standoff. However, each of the insulators in the foregoing patents engages and supports three consecutive convolutions of the coil, in some cases requires distortion of the coil beyond a mere spreading of the convolutions, and all have rather narrow bodies in the direction transverse to the coil axis which do little or nothing to prevent lateral movement of the coil after attachment to the insulator.

Above identified U.S. Pat. No. 4,692,599 utilizes a supporting frame for the insulating standoffs comprising circular section wire rods which are wrapped by multiple bending operations around the insulator bodies to hold them in place. The process of preforming, bending and closing the wire rods around the insulating bodies is complex and time consuming.

A number of the patents identified above utilize stamped sheet metal frames or bars to support the insulating standoffs. In Pat. Nos. 4,472,624 and 4,628,189, the insulators are pushed through slots in the stamped supporting frame and turned 90° allowing edges of the slots to be captured in grooves in the insulator body. In U.S. Pat. Nos. 4,250,399 and 4,528,441, tabs on the stamped sheet metal frame member are inserted into or through apertures in the insulator body and twisted or bent to retain the insulator in position.

All of the foregoing methods and apparatus for supporting the insulating standoffs are difficult or virtually impossible to automate, thereby requiring substantial manual labor in the assembly process.

In addition to the insulating standoffs shown in the previously identified U.S. patents, U.S. Pat. No. 5,122,640, commonly owned by the assignee of the present application, discloses another heating element coil support. The insulating support shown in the '640 patent includes a plurality of rectangular insulating supports, each of which retains and supports four separate coil portions. Although the insulating support shown in the '640 patent functions to retain the heating coil as desired, the relatively large ceramic insulating supports are relatively heavy and expensive to manufacture.

It would be most desirable to have an insulating standoff and support structure for a helical wire heating coil in which the coil is retained against either axial or lateral movement and the insulating standoffs can be easily attached to the support structure. It is also desirable to have an insulating standoff and support structure that lend themselves to fully automated assembly. Similarly, an insulating standoff constructed to permit direct linear insertion into the heating coil without undue coil distortion would also facilitate automated assembly of the coil to the standoffs.

BRIEF SUMMARY OF THE INVENTION

The present invention is a support structure for a helical wire heating coil that retains the heating coil against both axial and lateral movement while isolating the heating coil from electrical contact with other components. The support structure of the invention includes a support frame that securely spaces a plurality of insulating standoffs in a desired spacial relation. The insulating standoffs each engage and hold a portion of the heating coil to restrict movement of the heating coil in both the lateral and axial direction. The insulating standoffs preferably each support two coil portions and prevent electrical contact between the heating coil and the remaining portion of the support structure.

The insulating standoffs of the present invention each extend between a first end and a second end and have a front face and a back face surface. The insulating standoff has at least one wedge portion including a pair of ramped surfaces generally forming a point. In the preferred embodiment of the invention, a wedge portion is formed on each of the first and second ends of the standoff. The wedge portion is useful in separating the individual convolutions of the heating coil such that the heating coil can be supported by the standoff.

The insulating standoff of the present invention includes four coil grooves, a pair of which are formed in each of the front and back surfaces of the standoff. Preferably, a coil groove is positioned adjacent each of the wedge portions on both the front and back surfaces of the standoff. The coil groove is generally V-shaped and extends into the standoff from the respective front or back face surface a distance generally corresponding to the diameter of the heating coil wire. The coil groove is defined by a pair of angled contact surfaces that taper outward from the centerline of the standoff. A retainer tab extends into each of the coil grooves from the bottom of the respective wedge portion. The retainer tab contacts the inside surface of the heating coil, causing the heating coil to deflect outward such that the heating coil is pressed into contact with the contact surfaces defining the coil groove. In this manner, the coil groove is securely held in place on the standoff by three points of contact between the standoff and the heating coil. Likewise, the axial compression force of the helical wire heating coil holds the individual convolutions of the heating coil within the coil groove. In this manner, the heating coil is prevented from moving either laterally or axially out of the coil groove formed in the standoff.

In a preferred embodiment of the invention, the wedge portion has a width less than the width of the remaining body of the standoff. The reduced width of the wedge portion allows the insulating standoff of the present invention to be used with heating coil diameters of varying sizes, such that the insulating standoff of the present invention can be used in a variety of applications.

The support frame of the present invention includes a rail extending along a longitudinal axis. The support frame further includes a plurality of arms extending perpendicularly from the rail. Each of the arms includes a pair of tines that are spaced apart from each other to define an open slot. The open slot formed by the tines is defined at its back end by a back edge surface and at the front end by a pair of locking projections. One of the locking projections extends from each of the tines. Preferably, the distance between the locking projections, in the final assembled configuration, is less than the width of the open slot defined by the tines, such that the distance between the locking projections defines an entry opening into the open slot which is narrower than the open slot itself.

The support frame is preferably stamped from sheet metal. The tines formed on each arm of the support frame are received by a pair of attachment slots formed in the respective insulating standoff. To position the insulating standoff within the open slot formed in the arm, the tines on the arm are formed to be initially separated so the insulating standoff can be inserted linearly through the entry opening between the locking projections on the tines. When the standoff is positioned within the open slot, the tines are pressed together until the tines are fully received within the attachment slots in the standoff. When the standoff is positioned within the open slot, the distance between locking projections prevents the standoff from passing back through the entry opening. This construction readily facilitates automated assembly.

Other features and advantages of the invention may be apparent to those skilled in the art upon inspecting the following drawings and description thereof.

BRIEF DESCRIPTION OF THE DRAWINGS

The drawings illustrate the best mode presently contemplated of carrying out the invention.

In the drawings:

FIG. 2 is an enlarged, exploded perspective view of one of the insulating standoffs and an arm of the support frame of the present invention showing the interaction between the standoff and the helical wire heating coil supported thereon.

FIG. 3 is an enlarged front elevation view taken along line 3—3 of FIG. 1 showing the interaction between the insulating standoff of the present invention and the helical wire heating coil.

FIG. 4 is an enlarged sectional view taken along line 4—4 of FIG. 3 showing the interaction between the helical wire heating coil and the insulating standoff of the present invention.

FIG. 8 is an enlarged perspective view of one of the insulating standoffs of FIG. 7 showing the interaction between the standoff, the support frame and the helical wire heating coil in the assembly of a heating unit.

FIG. 9 is an enlarged front elevation view taken on line 9—9 of FIG. 7 showing the connection between the insulating standoff and the heating coil and support frame.

FIG. 10 is a sectional view taken on line 10—10 of FIG. 9.

DETAILED DESCRIPTION OF THE PREFERRED EMBODIMENT

Figure 1:
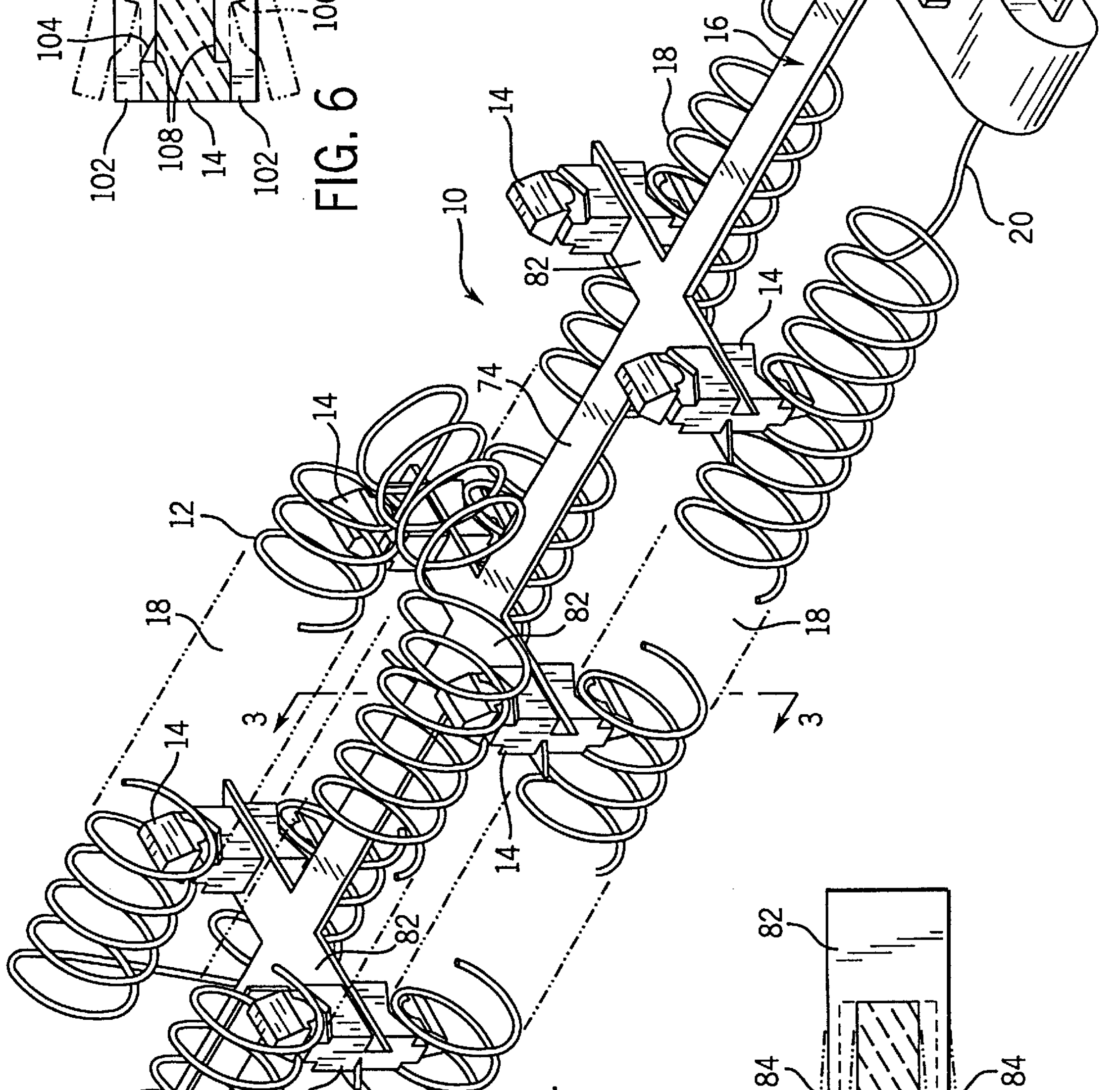
FIG. 1 is a perspective view of a heating element utilizing the support structure of the present invention.

Referring initially to FIG. 1, a heating element 10 includes a conventional helical wire resistance heating coil 12 mounted between a plurality of insulating standoffs 14 of the present invention. The insulating standoffs 14 are in turn held in two generally parallel spaced rows by a support frame 16 of the present invention. The heating coil 12 is of a continuous length and is disposed in four generally parallel coil sections 18 with the ends 20 of the coil wire attached to a conventional terminal block 22 for connection to a source of electric current. The support frame 16 includes a tongue 24 that supports the terminal block 22 to facilitate mounting the heating element 10 in an appliance.

Each of the insulating standoffs 14 of the present invention are generally rectangular and are used to position the coil sections 18 away from the support frame 16. In the preferred embodiment of the invention, the insulating standoffs 14 are formed from ceramic such that they prevent current from flowing into the support frame 16 from the coil,12.

As best seen in FIGS. 2–4, the insulating standoff 14 extends lengthwise along a longitudinal axis between a first end 26 and a second end 28. Each of the insulating standoffs 14 has a body portion 29 having a generally planar front face 30 and a generally planar back face 32. The front face 30 and the back face 32 are generally parallel and separated by a pair of edge surfaces 34 that define the overall thickness of the body portion 29 of the insulating standoff 14.

Both the first end 26 and the second end 28 of each insulating standoff 14 includes a wedge portion 36. Each of the wedge portions 36 includes a pair of ramp surfaces 38 which are outwardly divergent from the first end 26 and the second end 28 to the respective front face 30 and back face 32. Both the first end 26 and the second end 28 are defined by a generally flat surface 39 that defines the point of the respective wedge section 36. The width of each of the wedge portions 36 is defined by a pair of side surfaces 42 that are each spaced slightly inward from the edge surface 34, such that a shoulder 44 is formed between the side surface 42 and the edge surface 34.

Each of the insulating standoffs 14 includes four V-shaped coil grooves 46 that are used to retain the individual convolutions of the heating coil 12. As can be understood in the Figures, a pair of coil grooves 46 are formed in the front face 30 of the insulating standoff 14, and a pair of coil grooves 46 are formed in the back face 32 of the insulating standoff 14. Additionally, the coil grooves 46 are positioned such that one of the pair of the coil grooves 46 formed in the front face 30 is positioned directly adjacent the wedge portion 36 formed on the first end 26 of the standoff 14 and the second of the pair of coil grooves 46 formed in the front face 30 is positioned directly adjacent the wedge portion 36 formed on the second end 28 of the standoff 14. The coil grooves 46 formed in the back face 32 are located in the same positions as the coil grooves 46 in the front face 30, such that the standoff 14 has the same appearance when viewed from the front or back, or with the first end 26 up or the second end 28 up. This feature reduces the amount of labor required when assembling the heating element 10, since it is immaterial how the standoff 14 is oriented when mounted to the support frame 16. In this manner, each of the standoffs 14 is capable of supporting a first coil section 18 near its first end 26 and a second coil section 18 near its second end 28, as is shown in FIG. 4.

Each of the coil grooves 46 has a depth extending inwardly from either the front face 30 or the back face 32 of the insulating standoff 14. The coil grooves 46 are each defined by a pair of contact surfaces 48. The contact surfaces 48 are outwardly divergent from the centerline of the standoff 14 to the edge surfaces 34 of the standoff 14. Each of the contact surfaces 48 defines an abutment shoulder 50 at the intersection between the contact surface 48 and the edge surface 34. As can be seen in FIG. 2, the abutment shoulder 50 is spaced slightly from the shoulder 44 defined between the side surface 42 of the wedge portion 36 and the edge surface 34 of the standoff 14. In the preferred embodiment of the invention, the angle between the pair of contact surfaces 44, which defines the trough 52 of the V-shaped coil groove 46, is approximately 135°.

Each of the coil grooves 46 includes a generally flat, recessed surface 54 which is spaced inwardly from either the front face 30 or the back face 32 of the standoff 14. In the preferred embodiment of the invention, the recessed surface 54 is spaced inwardly by the height of the abutment shoulder 50 such that when the heating coil 12 is retained by the standoff 14, the depth of the coil groove 46 is approximately equal to the diameter of the wire 56 forming the heating coil 12, as can best be seen in FIG. 5. In this manner, the outermost portion of the wire 56 is approximately flush with the front face 30 and the back face 32 of the standoff 14 when the coil section 18 is supported by the standoff 14.

As can be seen in FIG. 4, the overall thickness of the insulating standoff 14 between surfaces 54 of the coil grooves 46 on the front face 30 and the back face 32 is greater than the distance "a" between individual convolutions of the heating coil 12. In this manner, the inherent resiliency of the heating coil 12 along the longitudinal coil axis extending lengthwise through any one of the coil sections 18 forces a pair of convolutions of the respective coil section 18 into the pair of the coil grooves 46 formed in the standoff 14, as will be discussed in greater detail below.

A retainer tab 58 is formed on each wedge portion 36 as shown in FIGS. 2 and 3. The retainer tab 58 is a generally semi-circular projection extending from the wedge portion 36 into the V-shaped coil groove 46. The retainer tab 58 generally extends into the coil groove 46 such that the portion of the retainer tab 58 extending furthest from either the first end 26 or the second end 28 of the standoff 14 is generally aligned with the trough 52 of the coil groove 46, as can be seen in FIG. 3. In the preferred embodiment of the invention, the outer edge surface 60 of the retainer tab 58 is spaced from the contact surfaces 48 defining the coil groove 46 by a distance sufficient to allow the wire 56 defining the heating coil 12 to be positioned between the retainer tab 58 and the contact surfaces 48 of the coil groove 46, as is shown in FIG. 4.

As can be seen in FIG. 3, the standoff 14 can securely hold heating coils 12 having a variety of diameters. Shown in FIG. 3 is a first size heating coil 12. The first size heating coil 12 is a ½ inch diameter heating coil in the preferred embodiment of the invention. The ½ inch heating coil 12 is retained by three points of contact with the insulating standoff 14. The first point of contact is between the inner edge 62 of the heating coil 12 and the outer edge 60 of the retainer tab 58. Since the coil groove 46 includes the pair of angled contact surfaces 48, the distance between the semi-circular outer edge 60 of the retainer tab 58 and the contact surfaces 48 varies when measured along the radius of the heating coil 12. Thus, the outside edge 64 of the heating coil 12 is pressed into contact with the pair of contact surfaces 48 defining the coil groove 46 at two locations. In this manner, the individual convolution of the heating coil 12 is slightly deformed such that the inherent resiliency of the heating coil 12 holds the heating coil 12 within the coil groove 46 at three separate contact points.

In addition to the ½ inch diameter heating coil 12, the insulating standoff 14 can also support larger heating coils, such as the 1 inch diameter heating coil 66 shown in phantom in FIG. 3. When the 1 inch diameter heating coil 66 is supported by the standoff 14, the outside edge 68 of the heating coil 66 is pressed into contact with the pair of abutment shoulders 50. Again, the inherent resiliency of the individual convolution of the heating coil 66 causes the heating coil 66 to contact the standoff 14 at three separate contact points such that the heating coil 66 is securely retained within the coil groove 46 formed in the standoff 14.

As can be seen in FIG. 3, the overall width of the wedge portion 36 between the side surfaces 42 is less than the overall width of the standoff body 29 between the edge surfaces 34. In this manner, the standoff 14 is able to securely retain heating coils having a small diameter, such as heating coil 12 shown in FIG. 3. As can be understood in FIG. 3, because of the difference in width between the wedge portion 36 and the body portion 29 of the standoff 14, the inside edge 62 of the heating coil 12 does not contact the edges 70 of the wedge portion 36 when the heating coil 12 is supported by the standoff 14. If the wedge portion 36 had the same width as the body portion 29 of the standoff 14, the heating coil 12 would contact the edges 70 of the wedge portion 36 and prevent the standoff 14 from supporting the heating coil 12, thereby restricting the number of coil sizes the standoff 14 could be used with.

Likewise, the contact surfaces 48 of each coil groove 46 extend outward past the edges 70 of the wedge portion 36 such that the standoff 14 can be used with heating coils having a larger diameter, such as heating coil 66. If the coil groove 46 was only as wide as the wedge portion 36, the heating coil 66 shown in phantom would not fit into the coil groove 46 without causing increased deformation to the individual convolution retained by the coil groove 46. Thus, by having a wedge portion 36 which is somewhat narrower than the body portion 29 of the insulating standoff 14, the insulating standoff 14 can be used with a wider variety of heating coil sizes.

Referring now to FIG. 4, the individual coil section 18 of the heating coil 12 is retained by the insulating standoff 14 as follows. Initially, the first end 26 of the insulating standoff 14, specifically the flat surface 39, is positioned between a pair of the individual convolutions of the coil section 18, such that the coil axis is perpendicular to the longitudinal axis of the standoff 14. With the standoff 14 positioned as such, the coil section 18 and the standoff 14 are pressed into contact with each other. As the contact force is continuously applied, the individual convolutions of the heating coil 12 travel down the angled ramp surfaces 38 such that the individual convolutions of the coil section 18 are separated. When the individual convolutions are separated by the distance equal to the width of the standoff 14, the standoff 14 is further pressed upward into the coil section 18 until the individual convolutions enter the coil grooves 46 between the retainer tab 58 and the contact surfaces 48.

When the insulating standoff 14 has been pushed far enough into the coil section 18, the inherent resiliency of the heating coil 12 in the direction of the coil axis forces the individual convolutions into each of the coil grooves 46 formed on the front face 30 and the back face 32, as is clearly shown in FIG. 4. Once the individual convolutions of the coil section 18 are within the coil grooves 46, the standoff 14 holds the coil section 18 in place. The inherent compressive force of the helical heating coil 12 prevents the coil portion 18 from becoming dislodged in the direction of the coil axis, while the three points of contact between the heating coil 12 and the retainer tab 58 and contact surfaces 48 prevent the coil section 18 from moving laterally with respect to the longitudinal axis of the standoff 14. In this manner, the standoff 14 securely holds the coil section 18 in place with respect to the standoff 14. The same steps detailed above are performed for the coil section 18 attached to the second end 28 of the standoff 14. Likewise, the corresponding steps are followed for each of the plurality of standoffs 14 shown in FIG. 1, such that the heating coil 12 can be securely supported by the plurality of standoffs 14 as shown.

Referring again to FIG. 1, the plurality of insulating standoffs 14 are supported in a pair of generally parallel rows by the support frame 16. In the preferred embodiment of the invention, the support frame 16 is a stamped metallic element formed of sufficient strength to support the standoffs 14. The support frame 16 generally includes an elongated rail 74 extending along a longitudinal axis between a first end 76 and a second end 78. The first end 76 includes the tongue 24 that provides the required support for the terminal block 22. The second end 78 includes an angled support tab 80 that is used as a point of attachment for the heating element 10 within an appliance, a heating duct or the like.

The support frame 16 includes a plurality of arms 82 extending outward from the elongated rail 74 between the first end 76 and the second end 78. Each of the arms 82 supports one of the insulating standoffs 14 such that the insulating standoffs 14 are able to hold the series of coil sections 18 away from the metallic support frame 16.

Referring now to FIG. 2, each of the arms 82 includes a pair of tines 84. The tines 84 are spaced from each other such that the tines 84 generally define an open slot 86 therebetween. The open slot 86 is defined by the inside edge 88 of each tine 84 and a back edge 90 formed on the arm 82. As can be understood in FIG. 2, each of the tines 84 terminates at its outermost edge with a tapered surface 92. The tapered surfaces 92 taper inward from the outer edge 94 of each tine and terminate in a locking projection 96. The locking projections 96 extend inward from the inside edge 88 of each tine 84 such that, in the final assembly, the distance between the two locking projections 96 is less than the distance between the two inside edges 88 of the tines 84. The locking projections 96 define an entry opening 98 that has a width less than the distance between the two inside edges 88 of the tines 84.

As can also be seen in FIGS. 2–4, each of the insulating standoffs 14 includes a pair of attachment slots 100. One of the attachment slots 100 is formed in the front face 30 and one of the attachment slots 100 is formed in the back face 32. The attachment slots 100 extend across the entire front face 30 and back face 32, respectively, at approximately the midpoint of the standoff 14 between the first end 26 and the second end 28. As can be seen in FIG. 4, the attachment slots 100 extend into the standoff 14 such that the thickness of the standoff 14 between the innermost surface of the attachment slots 100 is approximately the same as the distance between the inside edges 88 of the tines 84. As can be understood in FIG. 4, the width of the standoff 14 between the front face 30 and the back face 32 is greater than the width of the open slot 86 but less than the distance between the outer edges 94 of the tines 84. In this manner, the pair of tines 84 on each arm 82 can support the insulating standoff 14 when the standoff 14 is positioned within the open slot 86.

Figure 5:
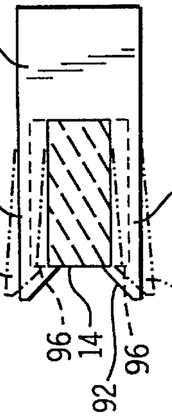
FIG. 5 is a partial sectional view taken along line 5—5 of FIG. 3 showing the interaction between the insulating standoff and an arm of the support frame.

Referring now to FIG. 5, the standoff 14 is positioned between the pair of tines 84 on the arm 82 with the tines 84 being formed initially to angle outwardly, as shown in phantom in FIG. 5. The tines 84 are angled outwardly to a sufficient degree such that the distance between the locking projections 96 is greater than the thickness of the standoff 14 between the pair of attachment slots 100. With the tines 84 sufficiently separated, the standoff 14 can be inserted therebetween. The tines 84 are then bent towards each other such that the tines 84 are received in the attachment slots 100 formed in the standoff 14. When the tines 84 are bent to their final assembled position, the locking projections 96 prevent the insulating standoff 14 from exiting the open slot 86 through the entry opening 98.

It is contemplated by the inventor that the standoff 14 could be inserted between the pair of tines 84 on the arm 82 in a variety of ways. For instance, the standoff 14 could pressed against the pair of ramp surfaces 92 with a sufficient amount of pressure to force the tines 84 to deflect outward until the distance between the locking projections 96 is greater than the thickness of standoff 14 between the attachment slots 100. Once the tines 84 are sufficiently separated, the standoff 14 could be slid into the open slot 86 and the tines 84 then pressed to their final position, such that the locking projections 96 hold the standoff 14 within the open slot 86. The tines 84 could be separated by other mechanical means, since the relatively brittle ceramic standoff 14 could be damaged by forcibly pressing the standoff 14 into the ramp surfaces 92. Preferably, however, the tines are formed to initially angle outwardly or to diverge slightly when the support frame 16 is stamped from sheet metal.

Figure 6:
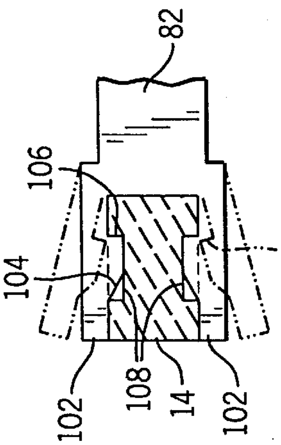
FIG. 6 is a view similar to FIG. 5 showing details of an alternate construction of the tines on an arm of the support frame.

Referring now to FIG. 6, there is shown a second embodiment of a possible configuration of the arm 82 and the standoff 14. In this embodiment, the tines 102 each include a ramp surface 104 spaced inwardly from the outermost edge of the tine 102. The ramp surface 104 projects inward from the tine 102 and includes a locking projection 106. In the second embodiment, the standoff 14 includes a pair of notches 108 rather than the attachment slots 100 described in the first embodiment. As with the first embodiment, the thickness of the standoff 14 between the pair of attachment notches 108 is less than the thickness of the remaining portion of the standoff, such that the locking projections 106 securely hold the standoff 14 between the tines 102. As with the first embodiment, the tines 102 are deflected outward such that the distance between the locking projections 106 is greater than the widest portion of the standoff 14. When the standoff 14 is positioned within the open slot 86, the tines 102 are compressed back to their original position such that the locking projections 106 prevent the standoff from exiting the open slot 86. Unlike the first embodiment, however, the tines 102 in the second embodiment must be deflected further outward, since the locking projections 106 are located further inward on the tines 102 and the distance between the locking projections 106 must be greater than the widest portion of the standoff 14. In this respect, the first embodiment is preferred over the second embodiment.

Once an insulating standoff 14 is positioned between the tines 84 contained on each arm 82, the heating coil 12 can be attached between the insulating standoffs 14 as shown in FIG. 1. Since attaching the plurality of insulating standoffs 14 to the support frame 16 requires simply bending the tines 84 outward and inserting the standoff 14 before returning the tines 84 to the original position, constructing the support structure shown in FIG. 1 is a rather simple and easy process requiring minimal work. In this manner, the support structure shown in the Figures is a vast improvement over presently available support structures which often require complex mounting arrangements for the insulating standoff members.

The heating element 110 of the embodiment shown in FIGS. 7–10 may utilize a support frame 116 which is identical to that shown in the embodiment of FIGS. 1–6. The insulating standoff 114 of the presently preferred embodiment of FIGS. 7–10 is very similar to the standoff 14 previously described. Thus, the standoff 114 has a body portion 129 of generally rectangular cross section with the body extending between narrow first and second ends 126 and 128, respectively. The body 129 includes generally planar front and back faces 130 and 132, respectively, which are parallel and separated by edge surfaces 134 that define the thickness of the body 129. Each end 126 or 128 includes a wedge portion 136 defined by ramp surfaces 138 that diverge outwardly from the end to the respective front and back face 130 and 132. As with the previously described embodiment, the length of the wedge portion 136 (in the direction of the major dimension of the body 129) is defined by a pair of side surfaces 142 that are spaced slightly inwardly from the corresponding edge surface 134 to form shoulders 144. Each end of the standoff 114 includes a generally V-shaped coil groove, formed in the front and back faces 130 and 132, adjacent the inner or most divergent edge of the ramp surface 138.

Referring particularly to FIGS. 8–10, the width of the body 129, between the front and back faces 130 and 132, is greater than the thickness of the previously described standoff 14. Each coil groove 146 is defined by an inner pair of outwardly divergent contact surfaces 144 and the outer edge surface 160 of a retainer tab 158 extending inwardly from the ramp surface 138. The contact surface 148 and the outer edge surface 160 are joined by a recessed surface 154 to define the coil groove 146. Because of the increased thickness of the body 129 of the standoff 114, the width of the contact surfaces 148 is greater than the width of the outer edge surface 160. The significance of the increased width of contact surfaces 148 is realized in the process by which the heating coil 112 is attached to the standoff 114. With the previously described embodiment, it has been found that, as the lower portions of the coil convolutions slide over the ramp surfaces 38 and are spread slightly apart, if the insertion movement is too rapid, the inner edges of the convolutions may by-pass the contact surfaces 48 (see FIGS. 2 and 4) before the inherent resilience of the coils permits them to retract into the coil grooves 46. The widened contact surfaces 148 of the preferred embodiment help assure that the coil convolutions will not by-pass the contact surfaces even during rapid linear insertion of the wedge portion 136 between adjacent coil convolutions 161.

Referring particularly to FIGS. 8 and 9, the insulating standoff 114 of this embodiment is provided with rounded abutment shoulders 150 at the outer edges of the contact surfaces 148 as compared to the sharp edged shoulders 50 of the previously described embodiment. It has been found that, particularly when utilizing a larger diameter coil 166, as shown in FIG. 9, sharp edged shoulders 50 might tend to scratch and damage the coil convolution, whereas the rounded abutment shoulders 150 obviate the problem. The edges 149 defining the intersections between the wedge side surfaces 142 and the lateral ends of the retainer tab 158 also provide contact and supplemental locking points for the inside edge 162 of the coil, particularly the small diameter coils such as coil 161. In addition to coil movement which may be caused by contact, the coil may move substantially by thermal expansion and contraction. Thus, it is desirable to have the coil groove 146 dimensioned to provide some movement, but still provide at least 3-point contact for the coil, as discussed with the previously described embodiment. For example, if a smaller diameter coil 161 moves out of contact with the contact surfaces 148, 3-point contact will still be maintained between the inside edge 162 of the coil and the edges 149 and abutment shoulder 150. Preferably, the edges 149 are rounded to minimize the possibility of the coil convolution being scratched by a sharp corner as a result of coil movement. The rounded edges 149 also add a redundancy to the coil locking feature of the standoff 114. If an abutment shoulder 150 is accidentally broken, lateral movement of the coil is still restrained by the rounded edge 149 on the opposite side of the standoff.

Figure 7:
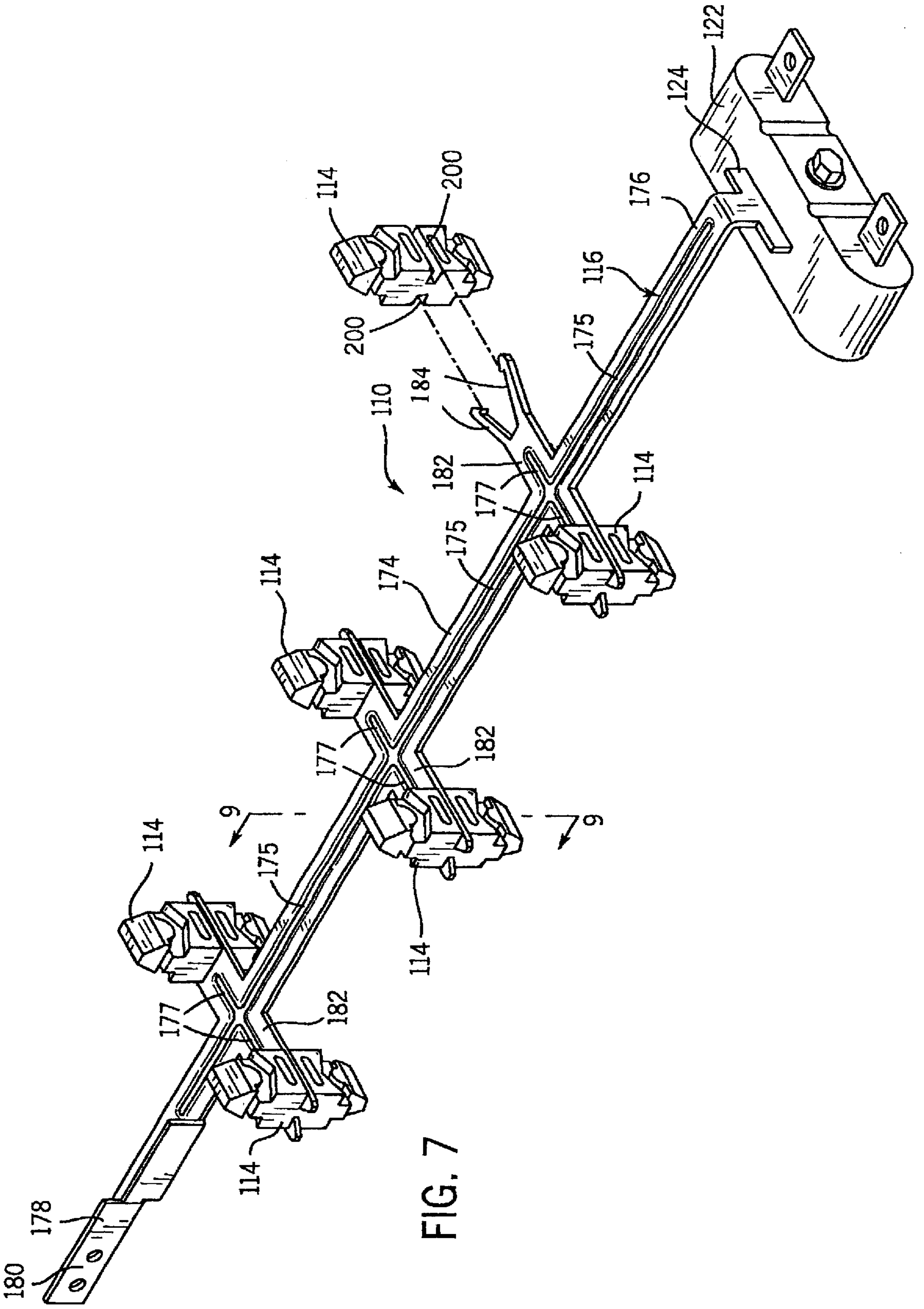
FIG. 7 is a perspective view similar to FIG. 1 showing a presently preferred embodiment of the insulating standoff and illustrating a manner in which it is adapted for automated assembly to the support frame.

Referring also to FIG. 7, the standoffs 114 are adapted particularly for automated attachment to the support frame 116 by direct linear insertion of the standoff between the tines 184 on support arms 182, in a manner generally similar to that previously described for the other embodiment. Thus, the stamped sheet metal support frame 116 is formed with the tines 184 in an initially divergent orientation, as shown particularly in FIGS. 7 and 8. Preferably, for automated assembly, the support frame 116 is supported in a fixture and all six insulators 114 are pushed simultaneously in a linear direction into the open spaces 186 between the divergent tines 184 all the way to the back edge 190. As with the previously described insulating standoff 14, the body 129 of the preferred insulator 114 is provided along both faces 130 and 132 with parallel attachment slots 200 extending the full length of the body. Upon insertion of the insulator 114 through the entry opening 198 between the tines 184, the tapered locking projections 196 on the ends of the tines pass through the attachment slots 200 and the base ends of the tines 184 (adjacent the back edge 190) are also initially received in the slots 200. This, of course, minimizes the initial spread or divergence which must be provided between the tines 184 in the initial stamping, as well as the amount by which the tines are squeezed back to a final locking position, as shown in FIG. 7. To compensate for slight misalignment or dimensional variations in the components, the edge surfaces 134 defining end openings 199 to the attachment slots 200 are provided with rounded portions or chamfers 201 to act as lead-ins for the tines 184.

The rail 174 of the support frame 116 is preferably provided with a longitudinal strengthening rib 175 that runs substantially the full length of the rail. Lateral rib portions 177 also extend from the main rib 175 into the arms 182.

It is recognized that various equivalents, alternatives and modifications to the invention as described are possible. Such equivalents, alternatives and modifications should be considered to fall within the scope of the following claims.

I claim:

1. A support assembly for a helical wire heating coil comprising:

a plurality of insulating standoffs, each of said standoffs having opposite faces, each face containing an attachment slot positioned such that the slots are parallel;

a one-piece support frame including, an elongate rail extending along a longitudinal axis between a first end and a second end; and a plurality of arms extending from the elongate rail between the first and second ends thereof, each of the arms supporting one of the insulating standoffs, each of the arms including a pair of tines, the pair of tines defining therebetween an open space dimensioned to receive one of the insulating standoffs inserted linearly into the space in the direction of said attachment slots and with the tines received in said slots.

2. The support frame of claim 1 wherein each of the tines includes a locking projection adapted to interact with the insulating standoff to retain the insulating standoff within the open space defined by the pair of tines on each of the arms.

3. A method for assembling a helical wire coil heating element comprising the steps of:

(1) providing a plurality of insulating standoffs with slotted opposite faces;

(2) forming a support frame having an arm for each standoff, each arm having a bifurcated end formed by a pair of tines, the free end of said tines defining an open-ended space;

(3) inserting each standoff in a linear direction into the open-ended space and causing the tines to be received in the slotted faces; and, (4) inserting each standoff wedge into the coil between adjacent coil convolutions causing said convolutions to be received and resiliently retained in said grooves.

4. The method as set forth in claim 3 wherein said forming step comprises stamping said support frame from sheet metal.

5. The method as set forth in claim 4 wherein in said stamping step, said tines are formed to diverge toward the free ends thereof.

6. The method as set forth in claim 5 wherein said inserting step includes the step of bending the tines on each arm toward one another to lock said tines in said slotted faces.

7. A support assembly for a resilient helical wire heating coil comprising:

a one-piece stamped sheet metal support frame having a plurality of pairs of tines, each tine pair defining an open space;

a plurality of insulating standoffs, each having a body in opposite sides of which are formed one of a pair of parallel attachment slots, said slots dimensioned to receive said tines in response to direct linear insertion of said standoff into said open space;

a wedge formed on an end of the standoff body, said wedge having ramp surfaces diverging from said end and dimensioned to spread apart adjacent coil convolutions in response to direct linear insertion of said wedge between said adjacent convolutions; and, a pair of coil retaining grooves in the body of the standoff, each groove located adjacent the most divergent edge of a ramp surface, said grooves dimensioned to resiliently receive and retain said adjacent convolutions in response to movement of portions of said convolutions past the most divergent edges of the ramp surfaces.

8. The assembly as set forth in claim 7 wherein the opposite sides of said standoff body are generally planar and parallel, and said attachment slots extend the full length of said sides and terminate in slot end openings.

9. The assembly as set forth in claim 8 including lead-in chamfers on the end openings of said slots.

10. The assembly as set forth in claim 8 wherein each of said coil retaining grooves is defined by a contact surface formed at an edge of the planar side of the body and a retainer surface formed at the most divergent edge of a ramp surface, said contact surface having a width in the direction of the coil axis greater than the width of said retainer surface.

11. The assembly as set forth in claim 10 wherein said contact surface is V-shaped and has opposite edges that are rounded.

12. A one-piece stamped sheet metal support frame for supporting insulating standoffs that in turn support a helical wire heating coil to form a heating element, said support frame comprising:

an elongated main center rail and a plurality of standoff support arms spaced along the rail and extending generally perpendicular thereto;

each arm having a bifurcated end including a pair of tines initially formed to diverge slightly from base ends attached to the arm to a widened entry opening at the free ends of the tines, said entry opening dimensioned to receive an insulating standoff for positioning between the tines; and, said tines being deflectable in the plane of the arm to lock the insulator therebetween.

13. The support frame as set forth in claim 12 wherein said rail includes at one end thereof an integral stamped mounting bracket.

14. The support frame as set forth in claim 13 wherein said integral mounting bracket is bent from the plane of the rail and the arms.

15. A support frame as set forth in claim 12 including a terminal support bracket integrally formed at one end of the rail.

16. The support frame as set forth in claim 15 wherein said terminal support bracket is bent from the plane of the rail and arms.

17. The support frame as set forth in claim 12 including the maim strengthening rib extending along the main center rail.

18. The support frame as set forth in claim 17 including lateral strengthening rib portions extending from the main rib into the support arms.

* * * * *